United States Patent [19]

Iyer

[11] Patent Number: 5,631,174
[45] Date of Patent: May 20, 1997

[54] METHOD FOR FORMING A SPACER WITH A PROGRADE PROFILE

[75] Inventor: Ravi Iyer, Boise, Id.

[73] Assignee: Micron Technology, Inc., Boise, Id.

[21] Appl. No.: 576,785

[22] Filed: Dec. 21, 1995

[51] Int. Cl.⁶ .............................. H01L 21/28; H01L 21/44
[52] U.S. Cl. ..................... 438/760; 438/763; 438/789; 438/790; 438/978
[58] Field of Search ...................... 437/235, 238, 437/240, 228, 982, 236, 40 SW, 41 SW

[56] References Cited

U.S. PATENT DOCUMENTS

| | | | |
|---|---|---|---|
| 4,752,591 | 6/1988 | Beitman | 437/186 |
| 4,818,335 | 4/1989 | Karnett | 156/644 |
| 4,872,947 | 10/1989 | Wang et al. | 156/643 |
| 4,935,380 | 6/1990 | Okumura | 437/44 |
| 5,051,380 | 9/1991 | Maeda et al. | 437/238 |
| 5,428,240 | 6/1995 | Lur | 257/389 |
| 5,449,640 | 9/1995 | Hunt et al. | 437/190 |
| 5,464,480 | 11/1995 | Matthews | 134/1.3 |

FOREIGN PATENT DOCUMENTS

| | | | |
|---|---|---|---|
| 0403050 | 12/1990 | European Pat. Off. | 437/982 |
| 59-222945 | 12/1984 | Japan | 437/982 |
| 61-154149 | 7/1986 | Japan | 437/240 |
| 62-235739 | 10/1987 | Japan | 437/240 |
| 62-235752 | 10/1987 | Japan | 437/982 |
| 63-048981 | 9/1989 | Japan | 437/240 |
| 3161926 | 7/1991 | Japan | 437/982 |

OTHER PUBLICATIONS

El-Kareh, Badih "Fundamentals of Semiconductor Processing Technology", Boston, (1995) pp. 117–120.

*Primary Examiner*—R. Bruce Breneman
*Assistant Examiner*—Matthew Whipple
*Attorney, Agent, or Firm*—Workman, Nydegger & Seeley

[57] ABSTRACT

A method for forming spacers having a prograde profile includes providing a semiconductor substrate having raised structures thereon having top and lateral surfaces. A layer of spacer material is then deposited conformably over the raised objects and the semiconductor substrate. A layer of compatible material having a lower viscosity at high temperature than the spacer material is then deposited conformably over the layer of spacer material. The layer of compatible material is then reflowed. The portions of the layer of spacer material and the layer of compatible material laterally enclosing the raised structures constitute spacers. The layer of compatible material is reflowed sufficiently to result in spacers having a prograde profile, i.e., to result in laterally outward facing surfaces of the spacers that slope laterally outward from the top surfaces of the raised objects downward.

27 Claims, 2 Drawing Sheets

METHOD FOR FORMING A SPACER WITH A PROGRADE PROFILE

BACKGROUND OF THE INVENTION

1. The Field of the Invention

The present invention relates to the manufacture of semiconductor devices. More particularly, the present invention is directed to a method for forming a spacer with a prograde profile useful for preventing stringers at the respective base of adjacent spacers, where the spacers are manufactured in the process of manufacturing semiconductor devices.

2. The Relevant Technology

Spacers are widely used in the manufacture of semiconductor devices to isolate laterally adjacent circuit elements. In DRAM devices, for example, spacers are employed to isolate wordlines and define source/drain regions. Spacers in DRAM devices are generally formed by deposition of a dielectric material over gate stacks. An anisotropic etch to remove the dielectric material from horizontal surfaces may follow. The resulting spacers laterally isolate the gate stacks from adjacent source/drain regions. The spacers also isolate the gate stacks from contact plugs that are subsequently formed. The contact plugs make contact with the source/drain regions and should be isolated from the gate stacks.

A problem often arises, however, due to sheer vertical or even slightly concave vertical spacer surfaces near the bottom of the spacers. The space between adjacent gate stacks after the spacer is formed is deposited with conductive material. Portions of the conductive material are then removed by etching, resulting remaining portions of conductive material. The sheer vertical or even concave vertical spacer surfaces can prevent the etch from removing all of the conductive material, resulting in "stringers" of conductive material along the base of the spacers. These stringers can cause a short between the remaining portions of conductive material, causing circuit and device failure.

A reliable, easily performed method of preventing such stringers along the base of spacers is thus needed.

SUMMARY AND OBJECTS OF THE INVENTION

An object of the present invention is to provide a method for forming a spacer with a prograde profile.

Another object of the present invention is to provide a method for substantially preventing stringer formation at the base of spacers.

Yet another object of the present invention is to provide a reliable, easily performed method of forming a spacer with a prograde profile.

In accordance with the present invention, a layer of spacer material is deposited conformably over raised objects on a semiconductor substrate. The raised objects have top and lateral surfaces. A layer of compatible material having a lower viscosity at high temperature than the spacer material is then deposited conformably over the layer of spacer material. The layer of compatible material is then reflowed. The portions of the layer of spacer material and the layer of compatible material laterally enclosing the raised structures constitute spacers. The layer of compatible material is reflowed sufficiently to result in laterally outward facing surfaces of the spacers that slope laterally outward from the top surfaces of the raised objects downward. The resulting outward sloped or prograde spacer profile does not shield any area near the base of the spacers from a subsequent etch, thus preventing the formation of stringers along the base of the spacers.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

As an overview, the present invention provides a method for preventing the formation of stringers along the base of spacers during the manufacture of semiconductor devices by providing a prograde profile on the outside surfaces of the spacers. This is accomplished by depositing a thin layer of compatible material over the spacer material, which compatible material has a lower viscosity at high temperature than the spacer material. The compatible material is then reflowed to form a prograde profile on the lateral surfaces of the spacers. The reflow time and temperature are selected such as not to result in any substantial reflow of the spacer material.

Figure 1:
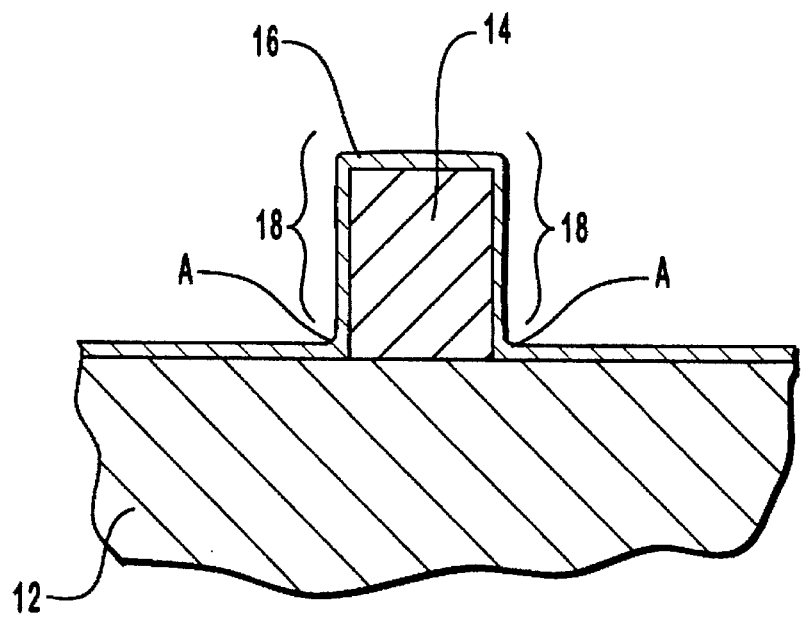
FIG. 1 is an elevational cross section of a portion of a partially formed integrated circuit structure.

According to the method of the present invention, a layer 16 of spacer material, preferably undoped silicon dioxide, is deposited conformably over a raised structure such as a gate stack 14 which has been formed on a substrate 12 as shown in FIG. 1. Layer 16 encloses gate stack 14 laterally and upwardly.

According to typical fabrication processes, the portions 18 of layer 16 laterally enclosing gate stack 14 would constitute spacers. The lateral surfaces of portions 18 are sheer and vertical or even slightly concave, presenting a neutral or even slightly retrograde profile. During subsequent process flow steps, spacers having a neutral or even slightly retrograde profile can partially shield conductive material that is intended to be removed, resulting in stringers of contact material at regions A near the base of portions 18.

Figure 2:
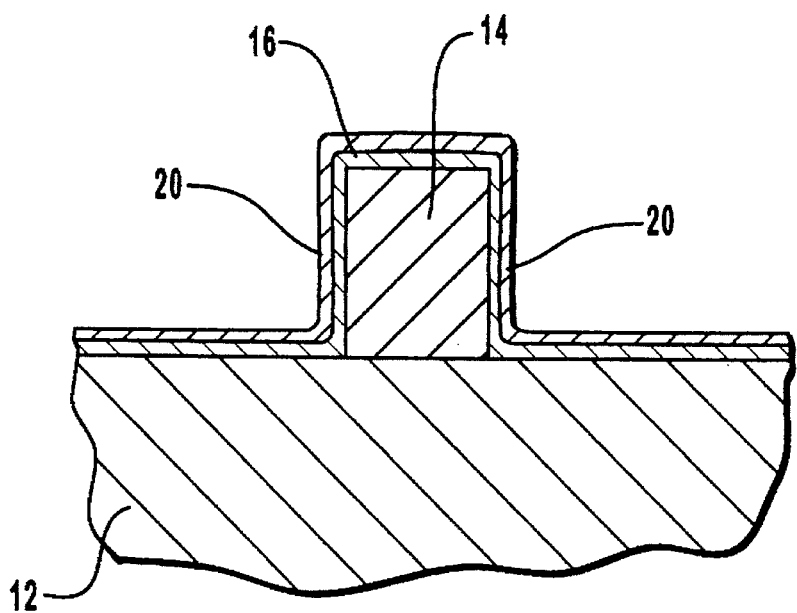
FIG. 2 is a cross section of the structure of FIG. 1 after deposition of a layer of compatible material.

The method of the present invention avoids this problem by depositing a layer 20 of compatible material, preferably boron doped silicon dioxide, over layer 16 of spacer material, as shown in FIG. 2. The compatible material is selected for its compatibility with the processes and materials used in the particular device being fabricated, and for its lower viscosity at high temperature than the spacer material.

Layer 20 of compatible material is then reflowed at sufficient time and temperature to cause layer 20 to flow downward slightly along the lateral surfaces of layer 16 of spacer material surrounding gate stack 14. The time and temperature are selected to provide adequate reflow of the particular compatible material without causing any substantial reflow of the spacer material.

Figure 3:
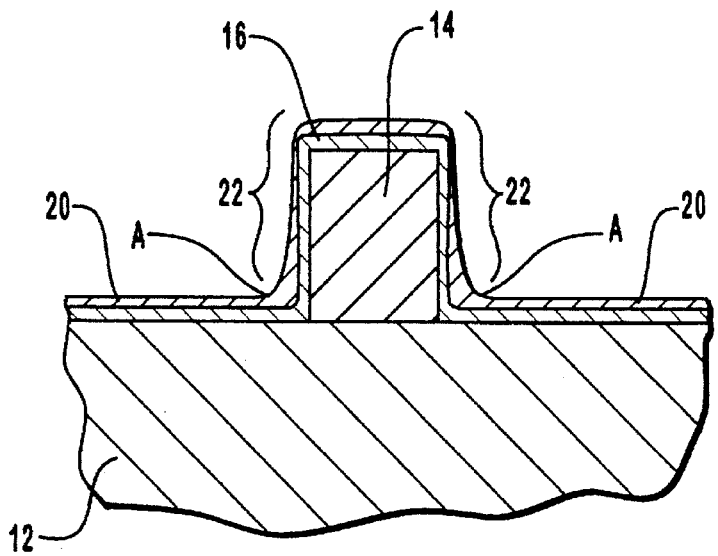
FIG. 3 is a cross section of the structure of FIG. 2 after a reflow of the layer of compatible material.

The reflow results in spacers 22 comprising the portions of layers 16 and 20 laterally enclosing gate stack 14, as shown in FIG. 3. Spacers 22 have a prograde, i.e., outward sloping toward the bottom, profile due to the reflow of layer 20, which results in layer 20 being thicker near the bottom of gate stack 14 than near the top thereof. Due to the prograde profile of spacers 22, conductive material (e.g. polysilicon) deposited at regions A is not shielded from a subsequent etch, allowing the etch to remove substantially all of the conductive material at regions A, and preventing thereby the formation of stringers.

The above described method of the present invention may be easily adapted to many and various semiconductor device fabrication processes involving the formation of spacers. Specific details of presently preferred ways for performing the above method are described below.

The presently preferred spacer material, undoped silicon dioxide, may be deposited by any suitable method, but is currently preferred to be deposited by a standard TEOS process or a TEOS-ozone process.

In a standard TEOS deposition process, such as in tube furnace TEOS deposition, undoped silicon dioxide may be deposited at a temperature in a range of about 600° to 700° C. at a pressure within a range of about 5–200 Torr. A carrier gas such as nitrogen or helium may be flowed through a TEOS bubbler and into the process tube, at a rate of about 50 sccm to 1000 sccm for a period in a range of about 10 to 5000 seconds, and oxygen may be flowed into the process tube at a flow rate in a range of about 50 sccm to 10,000 sccm. The TEOS in the TEOS bubbler is preferably maintained at a temperature in a range of 20° to 60° C.

In a TEOS-ozone deposition process, undoped silicon dioxide may be deposited on individual wafers in an Applied Materials 5000 from Applied Materials, Inc., located in the city of Santa Clara, in the state of Calif., U.S.A., or other similarly suitable equipment. Certain elements of suitable process equipment are shown diagrammatically in FIG. 4.

Figure 4:
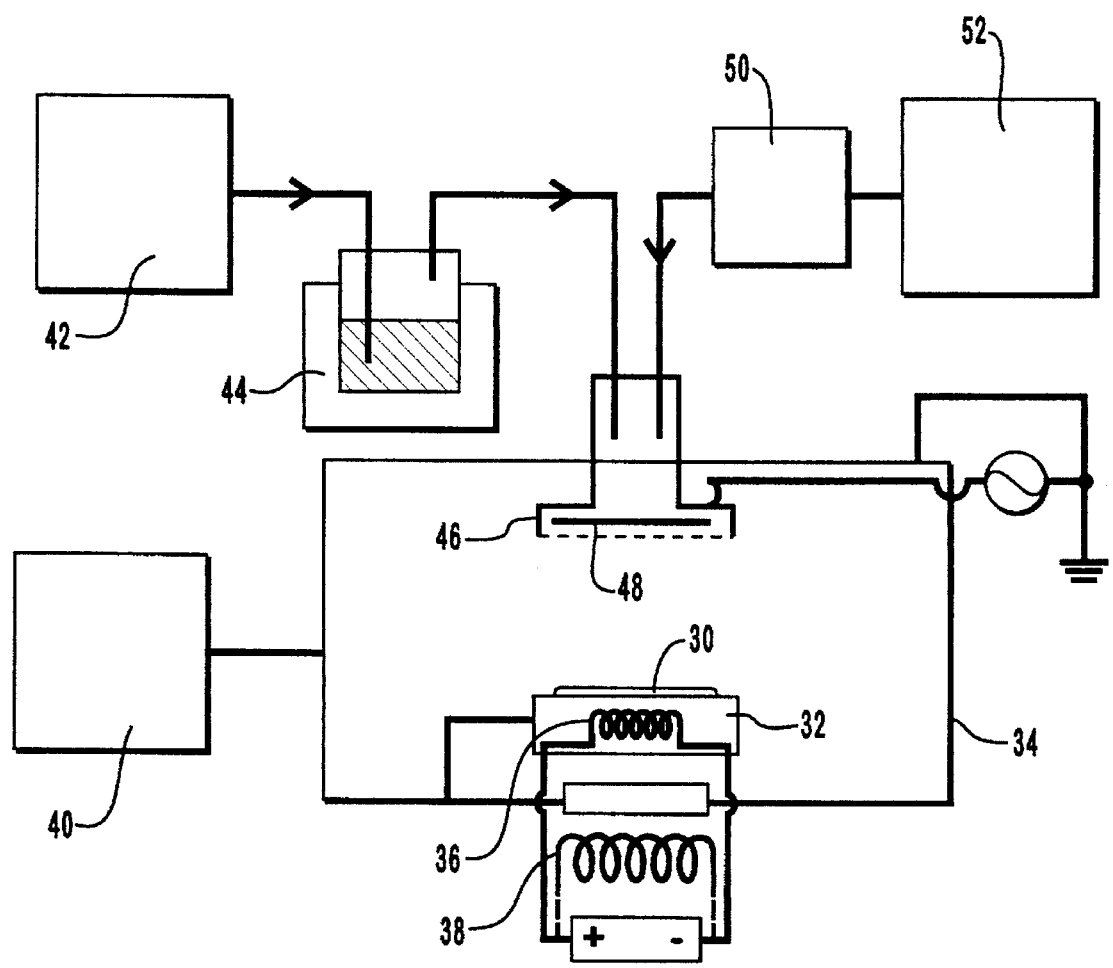
FIG. 4 is a schematic diagram of some equipment useful for performing the methods of the present invention.

In FIG. 4, a wafer 30 is located on and supported by a susceptor 32 contained in a process chamber 34. Chamber 34 and susceptor 32 are connected to ground. Susceptor 32 is maintained during the deposition process at a desired temperature, preferably within a range of about 300° to 500° C., by an electrical resistance coil heater 36 within susceptor 32, or alternatively by a lamp 38. A vacuum is drawn in chamber 34 by a suitable vacuum device 40, and the pressure in chamber 34 is preferably maintained at a pressure within a range of about 10 to 500 Torr during the deposition process.

TEOS is supplied by helium flowed from a helium source 42 through a TEOS bubbler 44 and into chamber 34 through a multiple orifice nozzle 46. Helium from source 42 is preferably flowed at a rate within a range of about 2000 to 5000 sccm. The TEOS in TEOS bubbler 44 is preferably maintained at a temperature in a range of about 45° to 55° C. Nozzle 46 can incorporate an electrode 48 which can be supplied with RF power at a frequency of 13.56 MHz. While RF power is not the preferred embodiment for the deposition, if RF power is used then it is preferred that the power level of the RF preferably be within a range of about 50 to 500 Watts. The RF potential thus created increases the energy level of gases flowing through nozzle 46.

Ozone is supplied to chamber 34 through nozzle 46 from a corona discharge chamber 50 which converts diatomic and monatomic oxygen from an oxygen source 52 into ozone. The flow of ozone is preferably maintained at a range of about 1000 to 6000 sccm flow rate with an ozone concentration in a range of 5–20%, with 14% most preferred.

Whether deposited by standard TEOS or TEOS-ozone techniques, the thickness of the deposited undoped silicon dioxide layer of spacer material is preferably within a range of about 800 to 1000 Angstroms, with about 1000 Angstroms most preferred. It preferable that the thickness of the layer of undoped silicon dioxide be sufficient to prevent any dopants from the subsequently deposited layer of compatible material from diffusing completely through the layer of undoped silicon dioxide spacer material, and thereby excessively decreasing the electrical insulating capabilities of the layer of spacer material.

After the preferred undoped silicon dioxide spacer material layer is deposited, the presently preferred layer of compatible material is deposited in the form of a layer of boron doped silicon dioxide. The boron doped silicon dioxide layer may be deposited by any acceptable process known to those of skill in the art, including CVD by decomposition of tetraethylborane. The presently preferred thickness of the layer of compatible material is in a range of about 50 to 2000 Angstroms, with about 500 Angstroms most preferred. The amount of boron dopant in the layer of compatible material is preferably in a range of about 0.5% to 6% by weight, and may be adjusted depending on the reflow characteristics desired, with higher dopant concentrations resulting in a greater amount of reflow. In the case of a topography having an area to be filled that has a high aspect ratio, an easier reflow is desirable.

Following its deposition, the layer of boron doped silicon dioxide is reflowed. The reflow may be performed in a rapid thermal processor, in a tube furnace, or in any similarly suitable device. In a rapid thermal processor, the layer of boron doped silicon dioxide is preferably reflowed at a temperature in a range of about 750° to 1000° C., with about 850° C. most preferred, for a time in a range of about 10 to 60 seconds, with about 20 seconds most preferred. In a tube furnace, the layer of boron doped silicon dioxide is preferably reflowed at a temperature in a range of about 800° to 950° C., most preferably about 850° C., for a time in a range of about 20 to 60 minutes, most preferably about 30 minutes. The reflow time and temperature may be adjusted together with the dopant concentration in the layer of boron doped silicon dioxide to achieve the desired spacer profile.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for preventing the formation of stringers at the base of spacers in the manufacture of a semiconductor device, said method comprising the steps of:

(a) providing a semiconductor substrate having raised structures thereon, said raised structures having top and lateral surfaces;

(b) depositing conformably over said substrate and said raised structures a layer of dielectric spacer material;

(c) depositing conformably over said layer of dielectric spacer material a layer of compatible material compatible with said dielectric spacer material and having lower viscosity at high temperature than said dielectric spacer material, wherein the layer of compatible material has a thickness in range of about 50 Angstroms to less than 1500 Angstroms; and (d) reflowing said layer of compatible material such that said layer of compatible material at said lateral surfaces of said raised structures is thicker in a lateral direction near the bottom of said raised structures than near the top of said raised structures.

2. The method as defined in claim 1, wherein the step of depositing conformably over said substrate and said raised structures a layer of dielectric spacer material comprises the step of depositing a layer of undoped silicon dioxide.

3. The method as defined in claim 2, wherein the step of depositing a layer of undoped silicon dioxide comprises the steps of:

(a) placing the substrate in a process chamber;

(b) drawing a vacuum in the process chamber and maintaining the pressure in the process chamber at a pressure in a range of about 10 to 500 Torr;

(c) maintaining the substrate at a temperature in a range of about 300° to 500° C.;

(d) flowing a carrier gas at a rate in a range of about 2000 to 5000 sccm through a bubbler having TEOS therein and into the process chamber while maintaining the TEOS in said bubbler at a temperature in a range of about 45° to 55° C.;

(e) flowing ozone into said process chamber at a rate in a range of about 1000 sccm to 6000 sccm and 5 to 20% concentration by weight; and (f) depositing the layer of undoped silicon dioxide to on said substrate having a thickness in a range of about 800 to 1000 Angstroms.

4. The method as defined in claim 3, wherein the step of drawing a vacuum in the process chamber and maintaining the pressure in the process chamber comprises maintaining the pressure in the process chamber at about 450 Torr.

5. The method as defined in claim 3, wherein the step of maintaining the substrate at a temperature comprises maintaining the substrate a temperature of about 400° C.

6. The method as defined in claim 3, wherein the step of flowing ozone into said process chamber comprises flowing ozone into said process chamber at a concentration of about 14% by weight.

7. The method as defined in claim 2, wherein the step of depositing a layer of undoped silicon dioxide comprises the steps of:

(a) placing the substrate in a tube furnace;

(b) maintaining the pressure in said tube furnace within a range of about 5 to 200 Torr;

(c) maintaining said substrate in said tube furnace at a temperature in a range of about 600° to 700° C.;

(d) flowing a carrier gas at a rate in a range of about 50 sccm to 1000 sccm through a bubbler having TEOS therein and into the tube furnace;

(e) flowing oxygen into the tube furnace at a rate in a range of about 50 sccm to 10,000 sccm; and (f) depositing the layer of undoped silicon dioxide to on said substrate having a thickness in a range of about 800 to 1000 Angstroms.

8. The method as defined in claim 1, wherein said compatible material comprises boron doped silicon dioxide.

9. The method as defined in claim 1, wherein the step of reflowing said layer of compatible material comprises the step of re flowing said layer of compatible material in a rapid thermal processor at a temperature in a range of about 750° to 1000° C. for a time in a range of about 10 to 60 seconds.

10. The method as defined in claim 1, wherein the step of reflowing said layer of compatible material comprises the step of reflowing said layer of compatible material in a rapid thermal processor at a temperature of about 850° C. for about 20 seconds.

11. The method as defined in claim 1, wherein the step of depositing conformably over said substrate and said raised structures a layer of dielectric spacer material comprises depositing a layer of dielectric spacer material having a thickness the in range of about 800 to 1000 Angstroms.

12. The method as defined in claim 11, wherein the layer of dielectric spacer material has a thickness of about 1000 Angstroms.

13. The method as defined in claim 1, wherein the step of providing a semiconductor substrate having raised structures thereon comprises providing a semiconductor substrate having gate stacks thereon.

14. The method as defined in claim 1, wherein said compatible material comprises silicon dioxide doped with 0.5% to 6% boron by weight.

15. A method for forming spacers having a prograde profile in the manufacture of a semiconductor device, said method comprising the steps of:

(a) providing a semiconductor substrate having raised structures thereon, said raised structures having top and lateral surfaces;

(b) depositing conformably over said substrate and said raised structures a layer of undoped silicon dioxide;

(c) depositing conformably over said layer of undoped silicon dioxide a layer of boron doped silicon dioxide, wherein the layer of boron doped silicon dioxide has a thickness in a range from about 50 Angstroms to less than 1500 Angstroms; and (d) reflowing said layer of boron doped silicon dioxide; wherein the portions of said layer of undoped silicon dioxide and said layer of boron doped silicon dioxide covering the lateral surfaces of said raised structures constitute spacers laterally enclosing said raised structures, and wherein said step of reflowing said layer of boron doped silicon dioxide results in said spacers having laterally outward facing surfaces sloping laterally outward from the top surface of said raised structures downward.

16. The method as defined in claim 15, wherein the step of providing a semiconductor substrate having raised structures thereon comprises providing a semiconductor substrate having gate stacks thereon.

17. The method as defined in claim 15, wherein the step of depositing a layer of undoped silicon dioxide comprises the steps of:

(a) placing the substrate in a process chamber;

(b) drawing a vacuum in the process chamber and maintaining the pressure in the process chamber at a pressure in a range of about 10 to 500 Torr;

(c) maintaining the substrate at a temperature in a range of about 300° to 500° C.;

(d) flowing a carrier gas at a rate in a range of about 2000 to 5000 sccm through a bubbler having TEOS therein and into the process chamber while maintaining the TEOS in said bubbler at a temperature in a range of about 45° to 55° C.;

(e) flowing ozone into said process chamber at a concentration in a range of about 5 to 20%; and (f) depositing the layer of undoped silicon dioxide on said substrate having a thickness in a range of about 800 to 1000 Angstroms.

18. The method as defined in claim 17, wherein the step of drawing a vacuum in the process chamber and maintaining the pressure in the process chamber comprises maintaining the pressure in the process chamber at about 450 Torr.

19. The method as defined in claim 17, wherein the step of maintaining the substrate at a temperature comprises maintaining the substrate a temperature of about 400° C.

20. The method as defined in claim 17, wherein the step of flowing ozone into said process chamber comprises flowing ozone into said process chamber at a concentration of about 14% by weight.

21. The method as defined in claim 15, wherein the step of depositing a layer of undoped silicon dioxide comprises the steps of:

(a) placing the substrate in a tube furnace;

(b) maintaining the pressure in said tube furnace within a range of about 5 to 200 Torr;

(c) maintaining said substrate in said tube furnace at a temperature in a range of about 600° to 700° C.;

(d) flowing a carrier gas at a rate in a range of about 50 to 1000 sccm through a bubbler having TEOS therein and into the tube furnace;

(e) flowing oxygen into the tube furnace at a rate in a range of about 50 sccm to 10,000 sccm; and (f) depositing the layer of undoped silicon dioxide on said substrate having a thickness in a range of about 800 to 1000 Angstroms.

22. The method as defined in claim 15, wherein the layer of boron doped silicon dioxide has a boron doping of 0.5% to 6% by weight.

23. A method for forming spacers having a prograde profile in the manufacture of a semiconductor device, said method comprising the steps of:

(a) providing a semiconductor substrate having gate stacks thereon, said gate stacks having top and lateral surfaces;

(b) depositing conformably over said substrate and said gate stacks a layer of undoped silicon dioxide by performing steps comprising:

(i) placing the substrate in a process chamber;

(ii) drawing a vacuum in the process chamber and maintaining the pressure in the process chamber at a pressure in a range of about 10 to 500 Torr;

(iii) maintaining the substrate at a temperature in a range of about 300° to 50° C.;

(iv) flowing a carrier gas at a rate in a range of about 2000 to 5000 sccm through a bubbler having TEOS therein and into the process chamber while maintaining the TEOS in said bubbler at a temperature in a range of about 45° to 55° C.;

(v) flowing ozone into said process chamber at a concentration in a range of about 5 to 20% by weight; and (vi) depositing the layer of undoped silicon dioxide on said substrate having a thickness in a range of about 800 to 1000 Angstroms;

(c) depositing conformably over said layer of undoped silicon dioxide a layer of boron doped silicon dioxide having a thickness in a range from about 50 Angstroms to less than 1500 Angstroms; and (d) reflowing said layer of boron doped silicon dioxide; wherein the portions of said layer of undoped silicon dioxide and said layer of boron doped silicon dioxide covering the lateral surfaces of said gate stacks constitute spacers laterally enclosing said gate stacks, and wherein said step of reflowing said layer of boron doped silicon dioxide results in said spacers having laterally outward facing surfaces sloping laterally outward from the top surface of said gate stacks downward.

24. The method as defined in claim 23, wherein the layer of boron doped silicon dioxide has a boron doping of 0.5% to 6% by weight.

25. A method for preventing the formation of stringers at the base of spacers in the manufacture of a semiconductor device, said method comprising the steps of:

(a) providing a semiconductor substrate having raised structures thereon, said raised structures having top and lateral surfaces;

(b) depositing conformably over said substrate and said raised structures a layer of dielectric spacer material;

(c) depositing conformably over said layer of dielectric spacer material a layer of compatible material compatible with said dielectric spacer material and having lower viscosity at high temperature than said dielectric spacer material, wherein the layer of compatible material has a thickness of about 500 Angstroms; and (d) reflowing said layer of compatible material such that said layer of compatible material at said lateral surfaces of said raised structures is thicker in a lateral direction near the bottom of said raised structures than near the top of said raised structures.

26. A method for forming spacers having a prograde profile in the manufacture of a semiconductor device, said method comprising the steps of:

(a) providing a semiconductor substrate having raised structures thereon, said raised structures having top and lateral surfaces;

(b) depositing conformably over said substrate and said raised structures a layer of undoped silicon dioxide;

(c) depositing conformably over said layer of undoped silicon dioxide a layer of boron doped silicon dioxide having a thickness of about 500 Angstroms; and (d) reflowing said layer of boron doped silicon dioxide; wherein the portions of said layer of undoped silicon dioxide and said layer of boron doped silicon dioxide covering the lateral surfaces of said raised structures constitute spacers laterally enclosing said raised structures, and wherein said step of reflowing said layer of boron doped silicon dioxide results in said spacers having laterally outward facing surfaces sloping laterally outward from the top surface of said raised structures downward.

27. A method for forming spacers having a prograde profile in the manufacture of a semiconductor device, said method comprising the steps of:

(a) providing a semiconductor substrate having gate stacks thereon, said gate stacks having top and lateral surfaces;

(b) depositing conformably over said substrate and said gate stacks a layer of undoped silicon dioxide by performing steps comprising:

(i) placing the substrate in a process chamber;

(ii) drawing a vacuum in the process chamber and maintaining the pressure in the process chamber at a pressure in a range of about 10 to 500 Torr;

(iii) maintaining the substrate at a temperature in a range of about 300° to 500° C.;

(iv) flowing a carrier gas at a rate in a range of about 2000 to 5000 sccm through a bubbler having TEOS therein and into the process chamber while maintaining the TEOS in said bubbler at a temperature in a range of about 45° to 55° C.;

(v) flowing ozone into said process chamber at a concentration in a range of about 5 to 20% by weight; and (vi) depositing the layer of undoped silicon dioxide on said substrate having a thickness in a range of about 800 to 1000 Angstroms;

(c) depositing conformably over said layer of undoped silicon dioxide a layer of boron doped silicon dioxide having a thickness of about 500 Angstroms; and (d) reflowing said layer of boron doped silicon dioxide; wherein the portions of said layer of undoped silicon dioxide and said layer of boron doped silicon dioxide covering the lateral surfaces of said gate stacks constitute spacers laterally enclosing said gate stacks, and wherein said step of reflowing said layer of boron doped silicon dioxide results in said spacers having laterally outward facing surfaces sloping laterally outward from the top surface of said gate stacks downward.

* * * * *